(12) United States Patent
Burkhart

(10) Patent No.: US 6,303,879 B1
(45) Date of Patent: Oct. 16, 2001

(54) LAMINATED CERAMIC WITH MULTILAYER ELECTRODES AND METHOD OF FABRICATION

(75) Inventor: Vincent E. Burkhart, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/251,697

(22) Filed: Feb. 17, 1999

Related U.S. Application Data

(63) Continuation-in-part of application No. 08/834,702, filed on Apr. 1, 1997.

(51) Int. Cl.$^7$ .................................................. H01R 23/68
(52) U.S. Cl. ........................... 174/261; 174/262; 361/803
(58) Field of Search ................................... 174/250, 255, 174/261, 262; 361/230–235, 803

(56) References Cited

U.S. PATENT DOCUMENTS

| | | | |
|---|---|---|---|
| 3,346,689 | 10/1967 | Parstorfer | 174/265 |
| 4,095,866 | 6/1978 | Merrill | 439/60 |
| 4,665,468 | 5/1987 | Dohya | 361/794 |
| 4,998,159 | * 3/1991 | Shinohara et al. | 174/255 X |
| 5,155,652 | 10/1992 | Logan et al. | 361/234 |
| 5,191,506 | 3/1993 | Logan et al. | 361/234 |
| 5,450,290 | 9/1995 | Boyko et al. | 361/792 |
| 5,475,264 | * 12/1995 | Sudo et al. | 257/723 |
| 5,633,783 | * 5/1997 | Yamamoto | 361/704 |
| 5,656,093 | 8/1997 | Burkhart et al. | 118/728 |
| 5,886,863 | * 3/1999 | Nagasaki et al. | 361/234 |

FOREIGN PATENT DOCUMENTS

| 62-286249 | 12/1987 | (JP) . |
|---|---|---|
| 3-163849 | 7/1991 | (JP) . |

* cited by examiner

*Primary Examiner*—Albert W. Paladini
(74) *Attorney, Agent, or Firm*—Thomason, Moser & Patterson, LLP

(57) ABSTRACT

An apparatus which includes a laminated ceramic body with multilayer electrodes and a method of fabricating this apparatus are disclosed. The laminated ceramic body is formed by layers of ceramic material, with portions of certain layers being silk screened with an intermediate layer of electrically conductive material. Subsequent sintering results in the formation of a solid ceramic body with multilayer electrodes made up of the electrically conductive material layers. The apparatus further comprises an electrical connector extending partially into the ceramic body and intersecting at least one of these electrodes.

8 Claims, 5 Drawing Sheets

LAMINATED CERAMIC WITH MULTILAYER ELECTRODES AND METHOD OF FABRICATION

CROSS-REFERENCE TO RELATED APPLICATIONS

This application is a continuation-in-part application of commonly assigned patent application Ser. No. 08/834,702 entitled CONDUCTIVE FEEDTHROUGH FOR A CERAMIC BODY AND METHOD OF FABRICATING SAME, filed Apr. 1, 1997 and incorporated herein by reference.

BACKGROUND OF THE DISCLOSURE

1. Field of the Invention

The present invention relates to semiconductor wafer processing equipment and, more particularly, to a conductive feedthrough extending from a volume containing atmospheric pressure through a ceramic body into a vacuum chamber, and further relates to a laminated ceramic body with multiple internal electrodes.

2. Description of the Background Art

A semiconductor wafer processing system generally contains a vacuum chamber within which is mounted a wafer support pedestal or susceptor. The pedestal is used to support the wafer within the chamber during processing. The pedestal contains various components which provide heating and/or cooling of the wafer as well as clamping (chucking) of the wafer to retain the wafer in a stationary position upon the pedestal surface. Such clamping is provided by either a mechanical clamp or an electrostatic chuck. Within the vacuum chamber, the space above the pedestal where the wafer is processed is generally maintained at a high vacuum. However, the space below or inside the pedestal is maintained at atmospheric pressure.

For high-temperature processes, such as high temperature physical vapor deposition, the pedestal may sometime be fabricated of ceramic. Heretofore, there has not been a convenient nor practical solution for providing an electrically conductive, yet vacuum sealed, connection through a ceramic pedestal such that electrical current can be passed from the atmosphere side of the pedestal to the vacuum side of the pedestal without violating the integrity of the vacuum.

Therefore, there is a need in the art for apparatus that provides a conductive feedthrough connection through a ceramic body, such as a ceramic pedestal, and a method of fabricating the feedthrough.

Additionally, electrostatic chucks are used to electrostatically attract and retain a semiconductor wafer during processing. In some plasma-based wafer processing operation, radiofrequency (RF) power may be coupled to the electrostatic chuck to bias the chuck in order to provide and/or enhance movement of ions in the plasma in the direction of the wafer during processing. The electrostatic chuck typically includes a ceramic body in which a pair of electrodes resides and upon application of DC voltage to the electrodes, the chuck electrostatically attracts a semiconductor wafer to the chuck according to the Johnsen-Rahbek effect. An electrostatic chuck utilizing the Johnsen-Rahbek effect is disclosed in U.S. Pat. No. 5,656,093 entitled WAFER SPACING MASK FOR A SUBSTRATE SUPPORT CHUCK AND METHOD OF FABRICATING SAME, Burkhart et al. inventors, patented Aug. 12, 1997; this patent is incorporated herein by reference. Further, when the electrostatic chuck is used in high temperature physical vapor deposition of the type noted above, the chuck may be biased by coupling RF power to the chuck. If the electrostatic chuck is RF biased by applying the RF power to electrodes embedded and residing in the semiconductor body, the electrodes and metal feedthroughs to the electrodes must be relatively large and thick to carry the RF power. The metal electrodes and metal feedthroughs carrying the RF power have a different coefficient of expansion than the body of ceramic in which they reside and since the metal electrodes and metal feedthroughs are heated during RF biasing, cracking of the body of ceramic can result, causing destruction of the electrostatic chuck, ruination of a partially processed semiconductor wafer residing on the chuck during breakage, and the need to open the chamber and replace the chuck.

Accordingly, there is a need in the art for an electrostatic chuck comprising a ceramic body having electrodes residing or embedded therein which do not cause ceramic breakage upon the application of RF bias to the chuck and heating of the electrodes.

SUMMARY OF THE INVENTION

The disadvantages heretofore associated with the prior art are overcome by the present invention of a conductive feedthrough connector for facilitating the flow of electrical current through a ceramic body. Specifically, ceramic bodies such as ceramic support pedestals are generally fabricated by stacking a plurality of layers of ceramic material (e.g., aluminum-nitride, alumina, and the like) and then sintering the stack of layers to cure the layers into a unitary, solid ceramic body. In accordance with the present invention, as each layer is positioned upon the stack, a portion of a select number of layers is silk screened with a conductive material (tungsten alloy) prior to the next layer being positioned atop the silk screened layer. Each silk screened region is coaxially aligned along a vertical axis through the ceramic body within another conductive region of another layer. The stack of silk screened layers are then sintered to form a solid ceramic body containing a plurality of stacked conductive electrodes.

Conductive vias are then formed vertically into one surface of the ceramic body to intersect the embedded electrodes. These vias are formed by drilling, bead blasting, etching, or some other process used to generate bores in the ceramic body. Using a physical vapor deposition (PVD), chemical vapor deposition (CVD), brazing or other means of metal deposition, the vias are filled with a conductive material such that the embedded electrodes are interconnected by one or more vertical conductive vias. Depending on the specific procedure used for this via-filling step, the surface may or may not be masked. Suffice to say that the exact procedure employed is not critical to practicing the present invention. A top end of the vias are exposed by lapping the surface of the ceramic body. As such, electrodes and other conductors can be sputtered onto the surface of the ceramic body and connect to the exposed ends of the vias.

Alternatively, conductive vias may also be formed by vertically boring through the layers, prior to sintering (i.e., while the ceramic is in a green state), and filling the vias with a conductive paste containing titanium (Ti), titanium nitride (TiN) or tungsten (W). These vias may be formed by inserting a solid cylindrical probe into the stack of green state ceramic, then packing the conductive paste into the bore. Subsequent sintering will allow both the ceramic layers and paste to harden, with the electrodes being interconnected by vertical conductive vias.

From the opposite side of the ceramic body (i.e., the side not containing the conductive vias), a bore is formed into the surface of the ceramic body passing through (intersecting) one or more of the layers of electrodes. An electrical connector member, or pin, is then brazed into this bore such that the pin conductively connects to the intersected layers of electrode. As such, a conductive path is formed between the conductive vias on one side of the ceramic body (e.g., the vacuum side) and the electrical connector on the other side of the ceramic body (e.g., the atmosphere side). This feedthrough is completely vacuum-sealed and permits a variety of electrical connections to be made to the feedthrough on the vacuum side of the ceramic body.

Alternatively, two or more conductive electrode stacks can be fashioned in various, laterally disparate, locations in the ceramic body. These electrode stacks are laterally interconnected with one another through conductive traces deposited (silk screened) between the ceramic layers.

In one illustrative application for the invention, the inventive feedthrough is used in a PVD system where the ceramic body is a Johnsen-Rahbek electrostatic chuck, and the feedthrough connector of the present invention provides current to a surface electrode located on the vacuum side of the chuck.

A laminated ceramic body having multiple spaced-apart electrodes formed therein, and an electrical connecting pin for the electrodes, is provided which permits the application of RF power with increased current capacity without the above-noted ceramic breakage due to electrode heating upon the application of the RF power. This structure is particularly useful as an RF biasable electrostatic chuck for semiconductor wafer processing such as high temperature physical vapor deposition.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
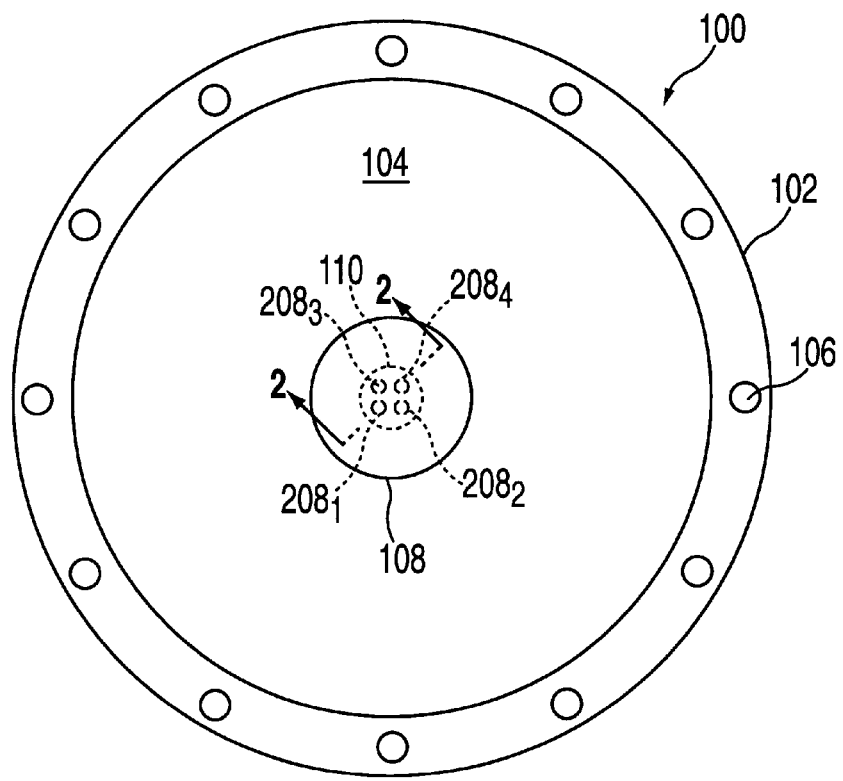
FIG. 1 is a top view of a ceramic wafer support pedestal containing the present invention.

FIG. 1 depicts a top plan view of an illustrative ceramic body containing the feedthrough of the present invention. In this illustrative example, the ceramic body is a ceramic wafer support pedestal, e.g., a Johnsen-Rahbek electrostatic chuck, for a semiconductor wafer processing system such as a physical vapor deposition system. However, those skilled in the art will realize from the following disclosure that the inventive feedthrough finds use in any application of a ceramic body where a conductive feedthrough is necessary.

Pedestal 100 contains a circumferential mounting flange 102 having a plurality of mounting bores 106. The support surface 104 of the pedestal 100 has illustratively affixed thereto an electrode 108. Although a single, centrally-located electrode is shown to illustrate one application of the invention, a multitude of electrodes may be affixed to the surface, or no electrode at all may be used and a feedthrough 110 may be positioned to supply electrical current to diagnostic equipment within a vacuum chamber. In the example shown, the feedthrough 110 of the present invention connects the vacuum side of the pedestal, e.g., the side that supports the wafer, to the atmosphere side of the pedestal.

Figure 2:
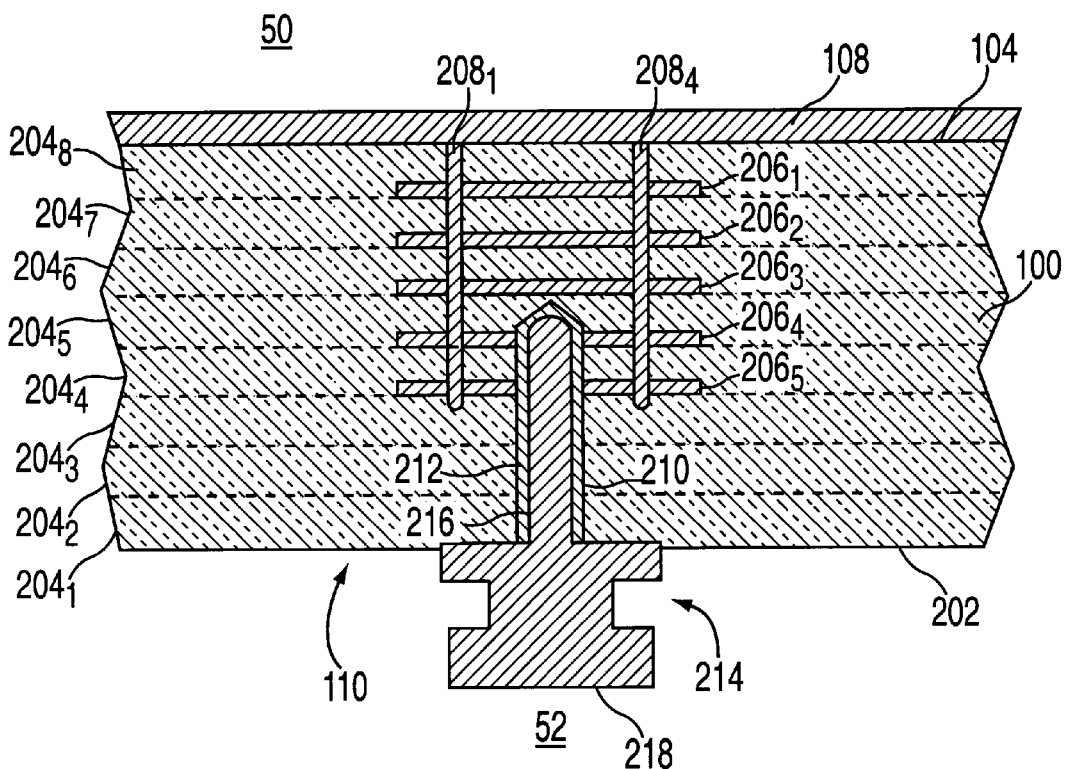
FIG. 2 is a cross-section of a portion of the ceramic wafer support pedestal taken along lines 2—2 of FIG. 1.

FIG. 2 depicts a cross-sectional view of a portion of the pedestal 100 taken along 2—2 of FIG. 1. This first embodiment of the invention is a single, vertical feedthrough 110 that conductively connects the vacuum side 50 of the pedestal 100 to the atmosphere side 52 of the pedestal 100. Illustratively, this feedthrough is supplying power to a conductive electrode positioned on the vacuum side of the pedestal, i.e., the electrode 108 affixed to surface 104. The atmosphere side 52 of the pedestal is located below surface 202 of the pedestal 100.

The feedthrough 110 contains a plurality of conductive layers 206 (e.g., $206_1$, $206_2$, $206_3$, $206_4$, and $206_5$) arranged vertically within the ceramic body and interconnected by a plurality of vias 208 (e.g., $208_1$, $208_2$, $208_3$ and $208_4$). The atmosphere side 52 is connected to the electrodes 206 by a bore 210 and a conductive pin 214 having a pin head 218 coupled to a shaft 216, whereby the shaft 216 is braised into the bore 210 such that the pin 214 electrically connects to one or more of the electrode layers 206.

More specifically, the ceramic body, represented by the pedestal 100, is fabricated of a plurality of stacked layers of ceramic material $204_1$, $204_2$, $204_3$ . . . $204_8$ . During the layering process, the layers of ceramic material are "dough-like" and are easily cut and shaped into a desired form. This state is commonly referred to as the "green state". During fabrication, as each layer of ceramic material (e.g., aluminum nitride (AlN)) is positioned atop the next, the electrodes 206 are silk screened upon selected layers. The silk screened regions are formed in a vertical stack as each of the ceramic layers are positioned. The silk screened regions are generally coaxially aligned along a vertical axis through the stack of ceramic layers. Generally, the electrodes are fabricated of a tungsten alloy that, when sintered, solidifies into a tungsten electrode. Once the stack of silk screened ceramic layers is complete, the stack is dewaxed to bake out any hydrocarbons in the ceramic material. Then, the stack is cured by sintering the ceramic layers at approximately 2000 deg. C. within a nitrogen atmosphere.

Once cured, one or more conductive vias (e.g., four vias) are vertically formed into the vacuum side 50 of the ceramic body 100. These vias 208 (specifically $208_1$, $208_2$, $208_3$, and $208_4$) are generally created by boring a hole in the ceramic body such that the hole passes through the plurality of ceramic layers 204 and through a plurality of electrodes 206. These bores are formed in the ceramic using conventional boring techniques such as bead blasting, drilling, etching and the like. Once the holes are formed, the vias are completed by depositing a conductive material e.g., a tungsten alloy) into the holes to interconnect the electrodes 206. Such deposition is accomplished using conventional techniques such as physical vapor deposition (PVD), chemical vapor deposition (CVD), or other means of depositing metals. After depositing the conductive material, the surface 104 of the ceramic body 100 is lapped to expose the top end of the vias. Once exposed, a conductive layer 108 can be sputtered on the surface 104. The exposed vias bond with the conductive layer 108. Alternatively, wires, current probes, and other electrical circuitry can be connected to the exposed vias.

Alternatively, these conductive vias may be formed by boring through the ceramic layers in their pre-cured, green state (prior to sintering), and then filling the bores with a conductive paste containing metals such as titanium, titanium nitride or tungsten. Subsequent sintering will allow the ceramic layers and paste to harden, with the electrodes being interconnected by vertical conductive vias. The bores may be formed in each layer and the layers aligned to produce a contiguous bore through the stack of layers, or a bore may be formed by pushing a cylindrical probe through the stacked layers. In either instance, once the bore is formed in the stack, the conductive paste is packed into the bore. Then, the assembly is sintered.

To complete the feedthrough 110, a bore 210 is formed into the surface 202 on the atmosphere side 52 of the ceramic body 100. The shaft 216 of the conductive pin 214 is then brazed 212 into the bore 210 such that the pin is in conductive contact with one or more of the electrodes 206. As such, the conductive via 208 is electrically connected to the pin 214 and provides a conductive path through the ceramic body.

The vias 208 are then be connected to, for example, an electrode 108 that is affixed to the surface 104 of the pedestal 100. As such, electric power can be applied to the atmosphere side of the ceramic body, and the power is carried through the feedthrough to the electrode 108.

Although the first illustrative embodiment of the invention depicts a pin connector on the atmosphere side of the ceramic body and the via connector on the vacuum side of the ceramic body, obviously the pin connector could be used on the vacuum side and the via connector used on the atmosphere side. Furthermore, a feedthrough may also be constructed having pin connectors on both sides of the ceramic body or a via connector on both sides of the ceramic body.

Figure 3:
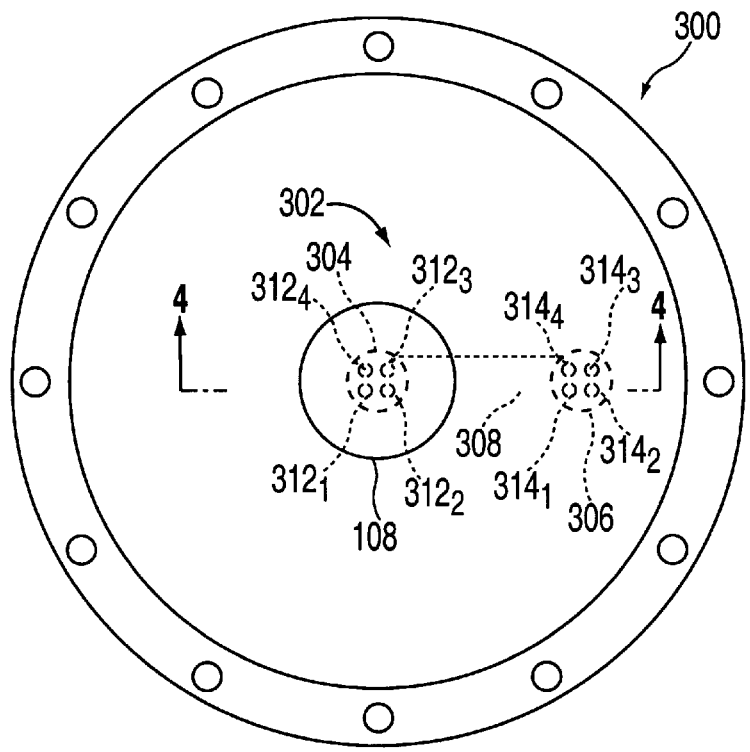
FIG. 3 is a top view of a ceramic wafer support pedestal containing an alternative embodiment of the present invention.

FIG. 3 depicts a top plan view of an alternative embodiment of the present invention. This embodiment contains a ceramic body 300 (e.g., a ceramic wafer support pedestal) with a feedthrough 302 electrically connecting a vacuum side 400 to an atmosphere side 402 of the ceramic body 300. Rather than a linear (vertical) connection from a pin to an electrode, this embodiment of the invention has the location of the pin connector 306 laterally offset from the location of the via connector 304. Specifically, a centrally located electrode 108 affixed to the support surface of the pedestal 100 is connected through an offset feedthrough 302 to the atmosphere side 402 of the pedestal.

Figure 4:
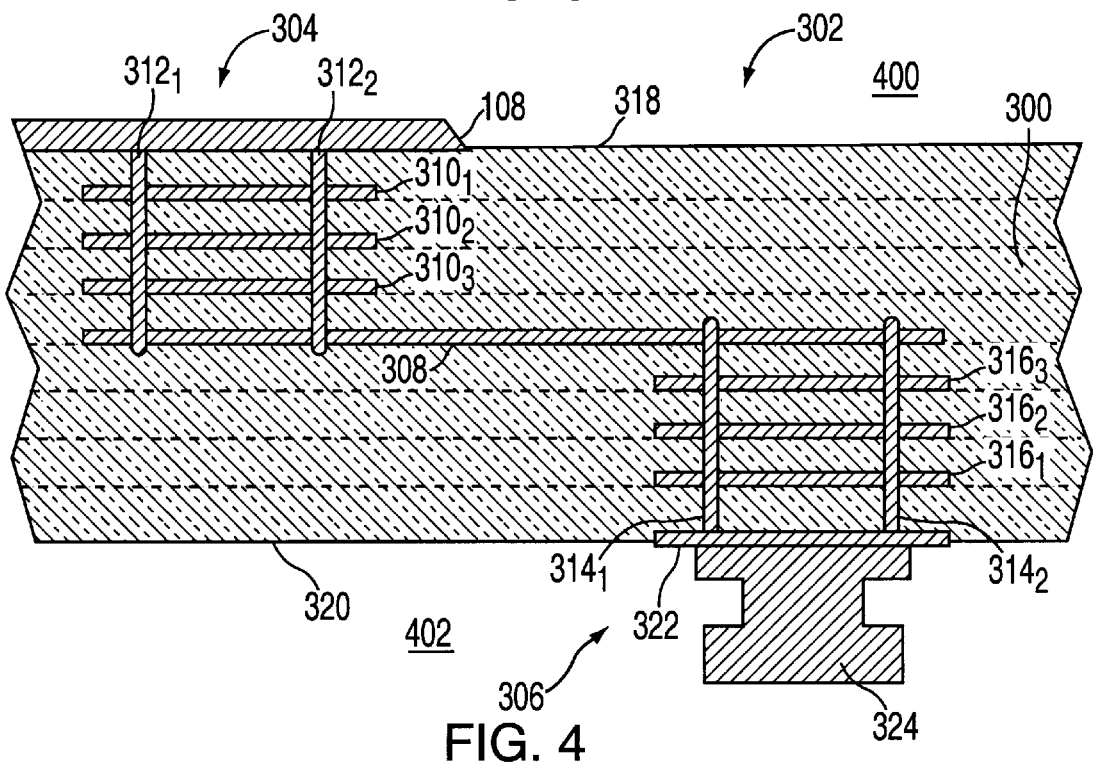
FIG. 4 is a cross-section of a portion of the ceramic wafer support pedestal taken along lines 4—4 of FIG. 3.

FIG. 4 depicts a cross-sectional view of the alternative embodiment taken along line 4—4 of FIG. 3. In this embodiment, the offset feedthrough 302 contains a pair of partial feedthroughs 304 and 306. These partial feedthroughs are laterally distant from one another and interconnected by a bus electrode 308. In the manner described above, a plurality of coaxially aligned electrode layers $316_1$, $316_2$, $316_3$ are formed within the ceramic body 300. Similarly, a plurality of coaxially aligned electrodes $310_1$, $310_2$, and $310_3$ are formed in the ceramic body 300. The electrodes 316 are laterally displaced from the electrodes 310. The two sets of electrodes are interconnected by bus 308. The bus is formed by silk screening a conductive trace upon one of the ceramic layers that forms the ceramic body such that one end of the trace forms an electrode in one set of electrodes and the other end of the trace forms an electrode in the other set of electrodes. As such, the bus 308 interconnects the two sets of electrodes 316 and 310. Once the layers of ceramic and conductive trace/regions are assembled, the body is baked and sintered to cure the ceramic into a unitary ceramic body.

Once cured, a plurality of conductive vias $312_1$, $312_2$, $312_3$ and $312_4$ are formed vertically into the ceramic body to interconnect the electrodes 310. Similarly, the electrodes 316 are interconnected by vias $314_1$, $314_2$, $314_3$ and $314_4$. The surfaces 318 and 320 of the ceramic body 100 are lapped to remove any residual conductive materials and to expose the vias 314 and 312. Alternatively, these conductive vias may be formed by boring through the ceramic layers in their pre-cured, green state (prior to sintering), and then filling the bores with a conductive paste containing a metal such as Ti, TiN or W. Subsequent sintering will allow the ceramic layers and paste to harden, with the electrodes being interconnected by vertical conductive vias.

Once the conductive vias are formed using one of the foregoing processes, electrodes 108 and 322 are deposited upon the surfaces of the ceramic body 100 using conventional metalization techniques. Then, an electrical contact pin 324 is brazed or soldered to the conductive pad 322. As such, when electrical current is applied to pin 324, that current flows to the electrode 108 through the offset feedthrough 302.

Of course, rather than utilize a surface mounted pin 324, a conductive pin 214 of FIG. 2 could be substituted for the surface mounted pin 324. Furthermore, a pin, surface mount or not, could be used on the vacuum side of the ceramic body.

By fabricating and using the invention as described, the integrity of a vacuum on one side of a ceramic body is maintained although electrical currents can be supplied through the ceramic body. This technique for creating a feedthrough extending through a ceramic body is applicable to any ceramic body, however, it has particular importance to ceramic wafer support pedestals including those that contain electrostatic chucks and/or ceramic heaters.

Figure 5A:
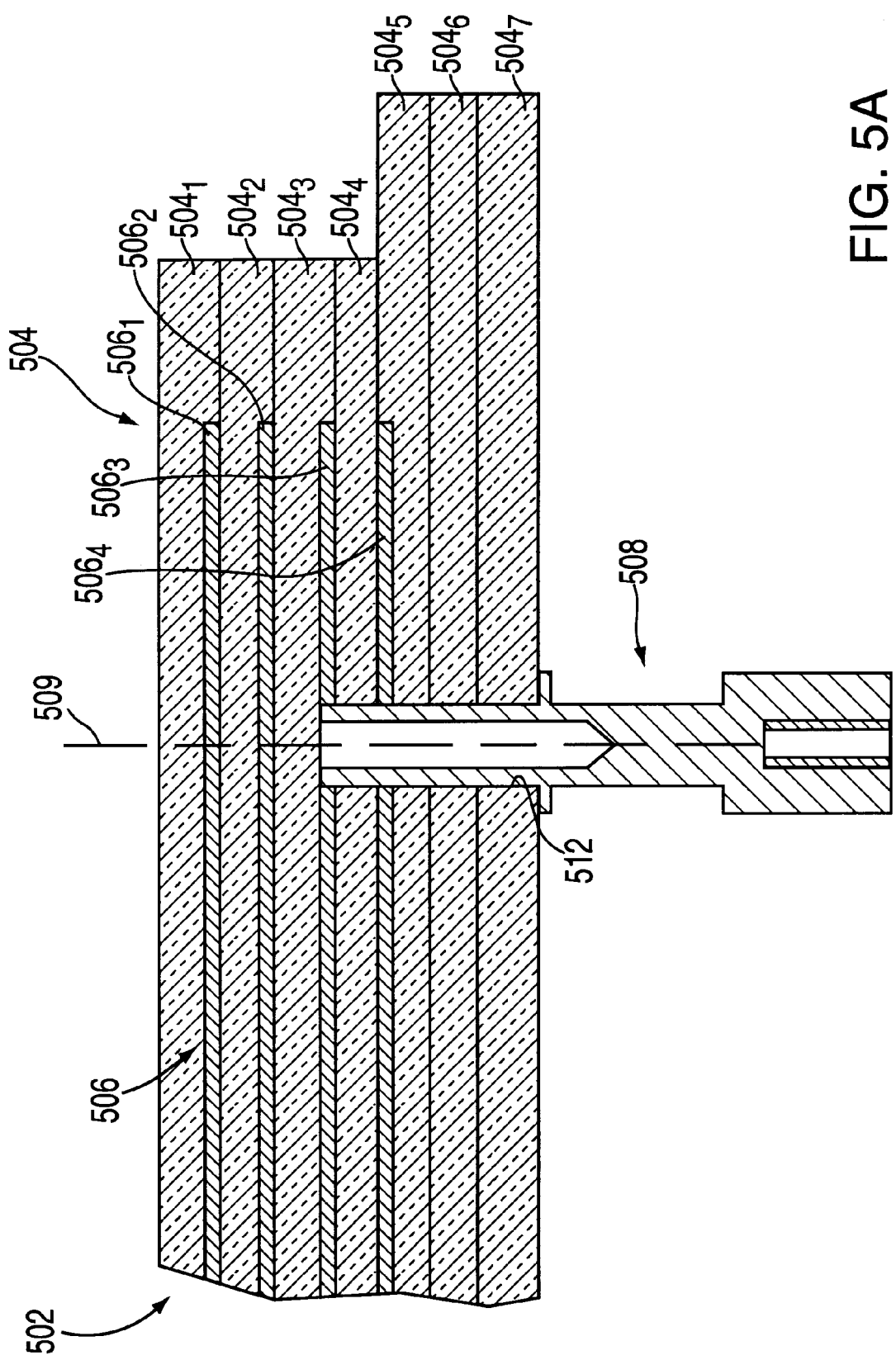
FIG. 5a is a cross-section of a portion of a further embodiment of a ceramic wafer support pedestal.

FIG. 5a is a partial transverse vertical cross-sectional view of an illustrative laminated ceramic body containing multilayer electrodes in accordance with the present invention. In this illustrative example, the ceramic body may be, for example, a ceramic wafer support pedestal, i.e., a Johnsen-Rahbek electrostatic chuck for a semiconductor wafer processing system such as a physical vapor deposition system. However, those skilled in the art will recognize from the following disclosure that this invention can find use in any application requiring a ceramic body and an internal electrode.

FIG. 5a depicts apparatus 502 includes a body 504 of ceramic, an electrode 506 embedded in the body of ceramic and an electrical connector 508 or connecting pin.

The body 504 of ceramic may be fabricated of a plurality of stacked layers of ceramic material $504_1$, $504_2$ . . . $504_7$ in the same manner and of the same ceramic material that the stacked layers of ceramic material $204_1$, $204_2$ . . . $204_8$ are fabricated as described hereinabove to form the pedestal 100 shown in FIGS. 1 and 2.

The electrode 506 includes a plurality of axially aligned (aligned along the axis 509 in FIG. 5a), parallel spaced-apart electrodes $506_1, 506_2 \ldots 506_4$ and may be fabricated in the same manner and of the same electrically conductive material that the plurality of electrodes or conductive layers $206_1$, $206_2 \ldots 206_5$ are fabricated as described hereinabove to form the plurality of conductive layers or electrodes $206_1$, $206_2 \ldots 206_5$ shown in FIG. 2. In this manner, the electrode 506 is "distributed" such that each layer will handle a portion of the RF current. As such, the RF current is carried by a large cumulative surface area of the layers $506_1$, $506_2 \ldots 506_5$.

After fabrication of the ceramic body 504 and the electrode 506, a bore 512 is suitably formed extending partially into the body of ceramic 504 and the forward end of the electrical connector member or pin 508 is inserted into the bore to intersect and to be mechanically and electrically connected to, such as by brazing or soldering, the electrodes $506_3$ and $506_4$. The pin 508 needs only contact a subset of all the layers, e.g., two of seven, or even just one, because the RF energy supplied to directly connected electrodes will capacitively couple to the remaining (floating) electrode layers.

Apparatus 502 is particularly useful as a ceramic pedestal for supporting a semiconductor wafer during processing and is particularly useful for coupling RF power to the electrode 506 and electrical connector 508 as may be required for wafer processing in high temperature physical vapor deposition. It will be understood that this is to provide RF on or beneath the wafer to attract ions from the plasma towards the substrate. Since the electrode 506 is comprised of a plurality of relatively thin electrodes $506_1, 506_2 \ldots 506_4$, less heating, and/or less concentration of thermal stress in localized portions of the chuck, is produced on coupling of RF power to the electrical connector 508 and electrode 506. Hence any tendency toward cracking or breakage of the body of ceramic 504 is reduced even if the body of ceramic 504 and electrode 506 have different coefficients of expansion. Upon the apparatus 502 being embodied as a ceramic pedestal, it will be understood that the apparatus 502 will include the mounting flange 102 provided with mounting bores 106 (or other mounting hardware) shown in FIG. 1.

Figure 5B:
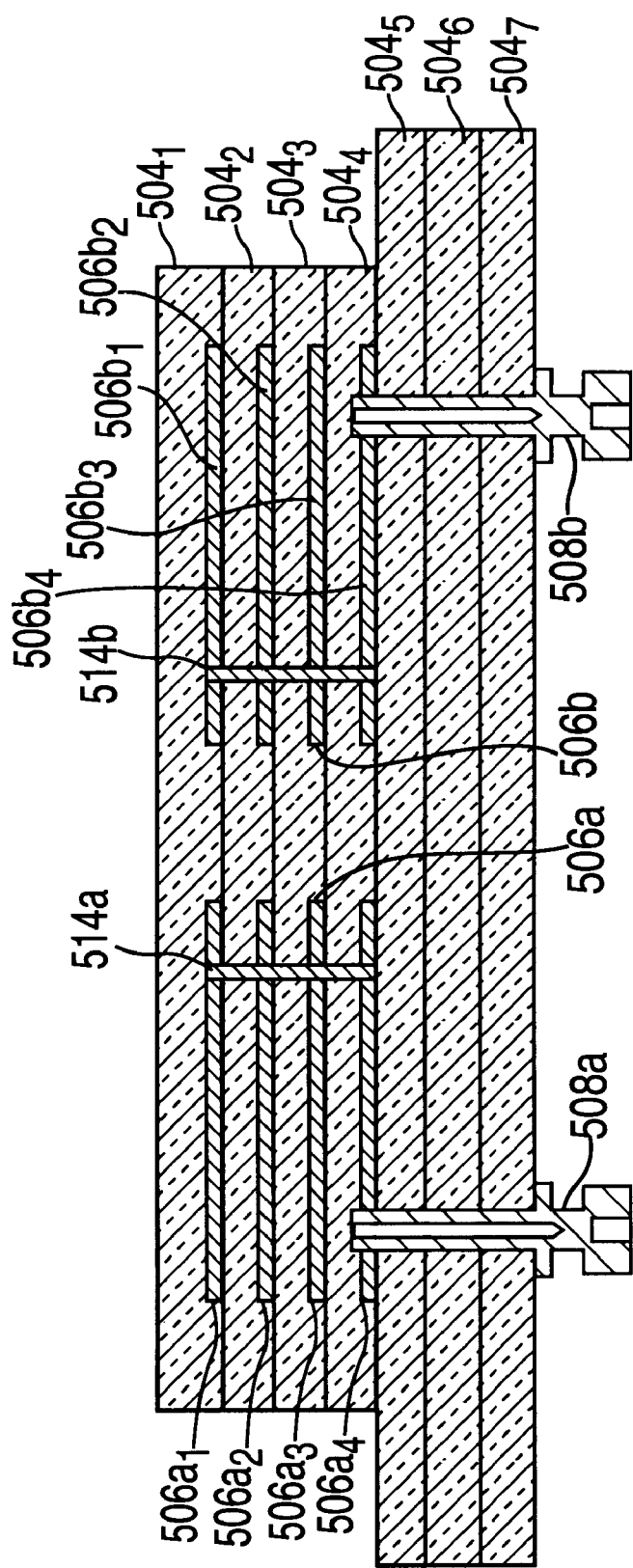
FIG. 5b is a cross-section of an embodiment of a bipolar electrostatic chuck using the present invention.

It will be further understood that apparatus 502 may include two sets of electrodes 506a and 506b, and electrical connecting pins 508a and 508b, spaced laterally from each other, as shown in FIG. 5b. Two conductive vias 514a and 514b are used to directly connect the bottom layer electrodes ($506a_4$, $506b_4$) to the top layer electrodes ($506a_1$, $506b_1$) within each set of electrodes, 506a and 506b. In this particular cross-sectional view, the intermediate layer electrodes ($506a_2, 506a_3, 506b_2, 506b_3$) are illustrated as "broken" around the vias 514a and 514b to emphasize that there is no direct connection between these electrodes $506a_2$, $506a_3, 506b_2$ and $506b_3$) and the conductive vias 514a and 514b. In this embodiment, the apparatus 502 is particularly useful as a RF biased electrostatic chuck for both electrostatically retaining a semiconductor wafer and biasing the wafer. Both RF and DC voltages are supplied to the two electrical connecting pins 508a and 508b. In this bipolar ESC configuration, the DC voltage applied to the two pins (508a, 508b) and to the top electrodes ($506a_1, 506b_1$) is used to attract a semiconductor wafer to the apparatus 502 in accordance with the Johnsen Rahbek effect. The RF power applied or coupled to the pair of connecting pins (508a, 508b) provides the RF bias necessary for wafer processing. As shown in FIG. 5b, pins 508a and 508b are electrically connected to the two bottom electrodes $506a_4$ and $506b_4$. In this configuration, the RF power from the bottom electrodes $506a_4$ and $506b_4$ is coupled to the top of the chuck by a direct connection to the top electrodes ($506a_1$, $506b_1$) through the two conductive vias (514a, 514b), and capacitive coupling via the other floating electrodes ($506a_2, 506b_2$, $506a_3, 506b_3$). This RF bias is then coupled to the entire wafer through the top electrodes $506a_1$, and $506b_1$. Again, such distributed RF coupling through multiple-layered electrodes can minimize local thermal stress that may otherwise arise from excessive heating when only a single electrode is used. It is understood that the embodiment shown in FIG. 5b may be fabricated using different combinations of the same process steps (stacking material layers, drilling and filling conductive vias and sintering) previously described. For example, this embodiment may be fabricated by stacking the respective ceramic layers $504_i$ (i = 2 to 7) and the electrode layers $506a_i$ and $506b_i$ (i=2 to 4) in proper sequence, forming the conductive vias 514a, 514b, followed by the silk-screening of electrodes $506a_1$, $506b_1$, stacking the ceramic layer $504_1$ on top of the electrodes $506a_1, 506b_1$ and sintering the entire structure.

Figure 6:
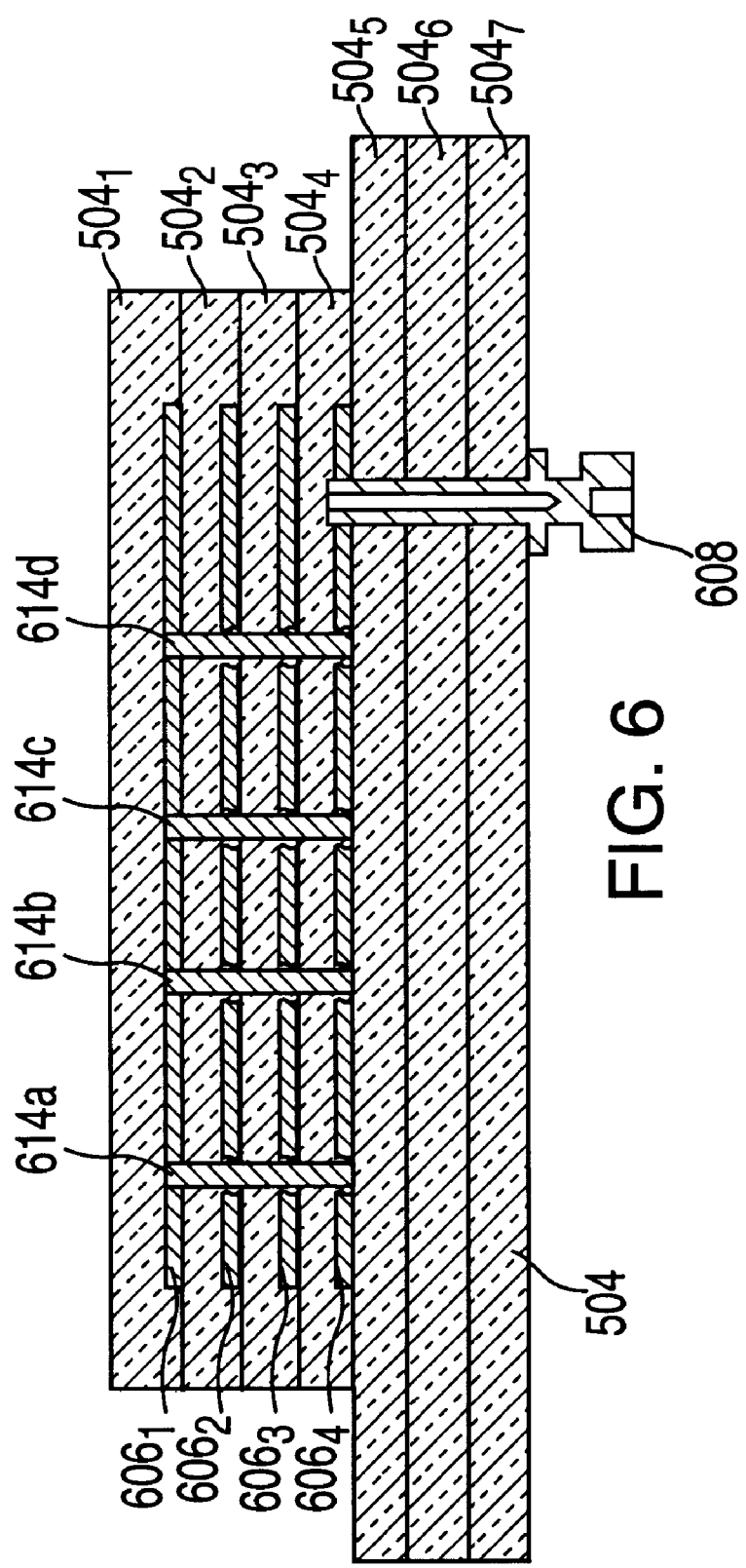
FIG. 6 is a cross-section of another embodiment of an electrostatic chuck having multiple conductive vias between electrodes.
Figure 3:
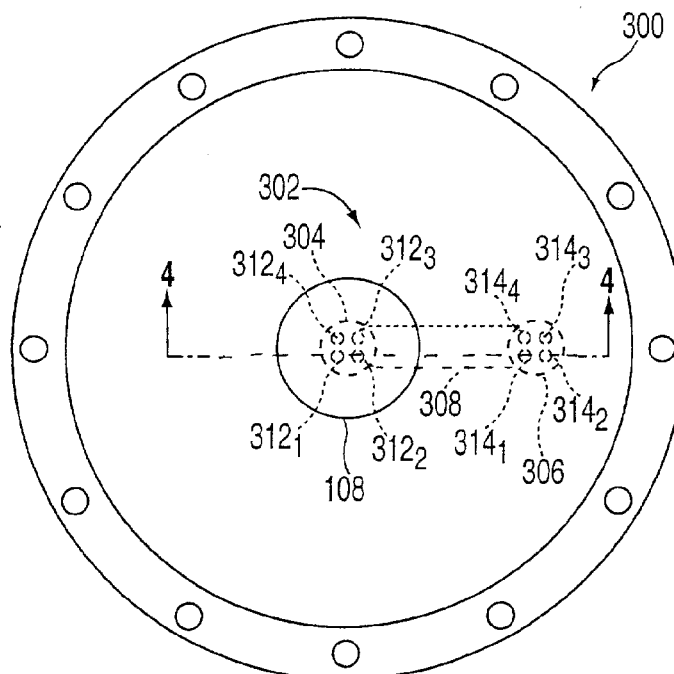
Figure 4:
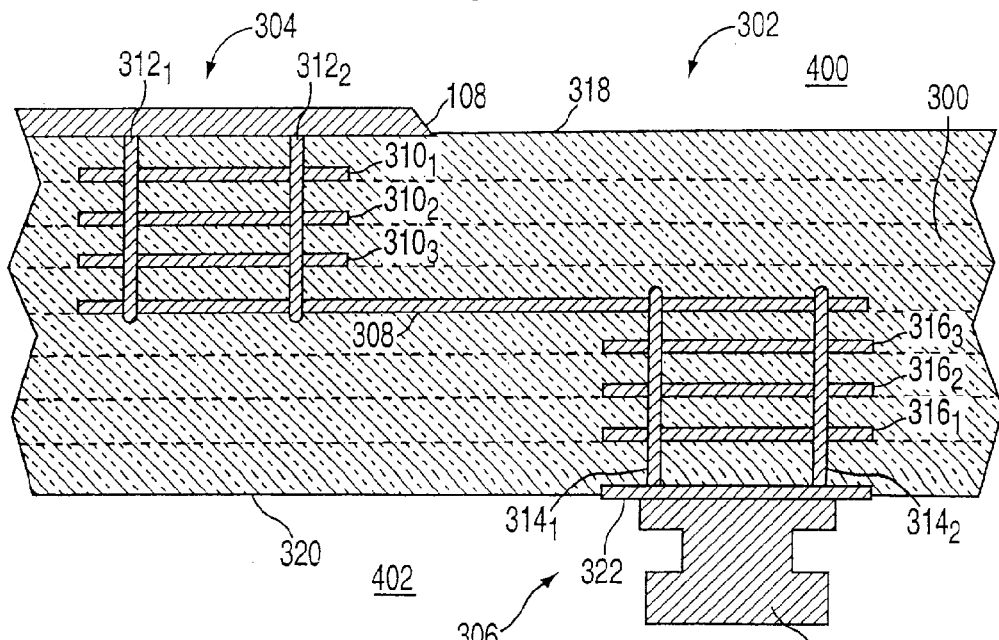
Figure 3:
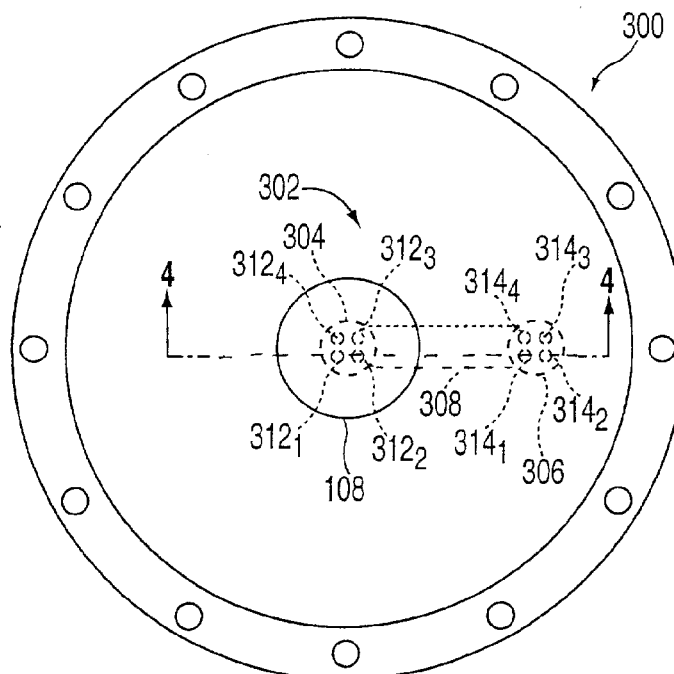
Figure 4:
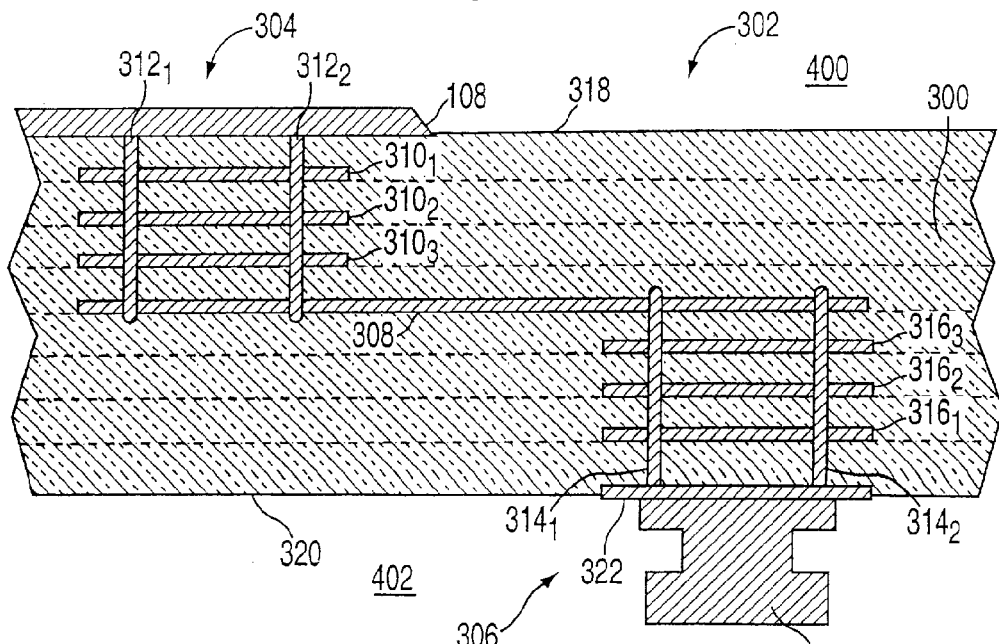

Another alternative embodiment is shown in FIG. 6, where a pin 608 is shown to intersect a bottom layer electrode $606_4$ within the chuck body 504. Multiple direct connections are formed between this bottom electrode $606_4$ and the top electrode $606_1$, as illustrated by the conductive vias 614a, 614b, 614c, and 614d. Again, intermediate electrodes $606_3$ and $606_2$ are shown as "broken" around these conductive vias 614a, 614b, 614c, and 614d to emphasize that there is no direct connection between these electrodes ($606_3$ and $606_2$) and the conductive vias (614a, 614b, 614c, and 614d). Similar to the embodiment in FIG. 5b, both RF and DC powers may be supplied to the pin 608. As previously discussed, capacitive coupling of RF power takes place via the intermediate electrodes $606_3$ and $606_2$. The DC and RF powers are both coupled to the top electrode $606_1$ through multiple direct connections provided by the vias 614a, 614b, 614c and 614d. Again, such a configuration minimizes the potential of breakage of the chuck due to local thermal stress that may otherwise arise if the power were concentrated on a single connection alone.

There has thus been shown and described a novel apparatus for providing a feedthrough connection through a ceramic body and a laminated ceramic body containing a multilayer electrode. Many changes, modifications, variations and other uses and applications of the subject invention will, however, become apparent to those skilled in the art after considering the specification and the accompanying drawings which disclose the embodiments thereof. For example, such a multilayer electrode arrangement is also applicable to plasma etching or deposition processes employing electrostatic chucks. All such changes, modifications, variations and other uses and applications which do not depart from the spirit and the scope of the invention are deemed to be covered by the invention, which is to be limited only by the claims which follow.

What is claimed is:

1. Apparatus for electrostatically retaining a substrate, comprising:
    a ceramic body;
    a plurality of parallel spaced-apart electrodes disposed in said ceramic body, said plurality of parallel spaced-apart electrodes having at least one powered electrode and at least one floating electrode disposed above said at least one powered electrode; and
    an electrical connector extending partially inwardly into said ceramic body, intersecting and electrically connected to said powered electrode.

2. The apparatus according to claim 1 wherein said ceramic body comprises a plurality of sintered layers of ceramic.

3. The apparatus according to claim 2 wherein said sintered ceramic is sintered aluminum nitride.

4. The apparatus according to claim 1 wherein said electrodes comprise a plurality of parallel spaced-apart layers of solidified electrically conductive material.

5. The apparatus according to claim 4 wherein said solidified electrically conductive material is solidified tungsten alloy.

6. The apparatus according to claim 1 wherein said electrical connector intersects and is mechanically and electrically interconnected to at least two of said electrodes of said plurality of electrodes.

7. The apparatus according to claim 1 wherein a top most electrode within said plurality of parallel spaced-apart electrodes is directly connected to at least one of said electrodes being intersected by and connected to said electrical connector.

8. The apparatus according to claim 1, wherein said one electrode being intersected by and connected to said electrical connector is a bottom most electrode within said plurality of parallel spaced-apart electrodes, and said bottom-most electrode is directly connected to a top-most electrode within said plurality of parallel spaced-apart electrodes.

* * * * *

UNITED STATES PATENT AND TRADEMARK OFFICE
CERTIFICATE OF CORRECTION

PATENT NO.    : 6,303,879 B1
DATED         : October 16, 2001
INVENTOR(S)   : Vincent E. Burkhart It is certified that error appears in the above-identified patent and that said Letters Patent is hereby corrected as shown below:

<u>Drawings,</u>
Delete Fig. 3, and substitute therefore the Fig. 3 as shown on the attached page.

Signed and Sealed this

Eighth Day of October, 2002

Attest:

Attesting Officer

JAMES E. ROGAN
*Director of the United States Patent and Trademark Office*

UNITED STATES PATENT AND TRADEMARK OFFICE
CERTIFICATE OF CORRECTION

PATENT NO. : 6,303,879 B1
DATED : October 16, 2001
INVENTOR(S) : Vincent E. Burkhart It is certified that error appears in the above-identified patent and that said Letters Patent is hereby corrected as shown below:

Drawings,
Delete Fig. 3, and substitute therefore the Fig. 3 as shown on the attached page.

This certificate supersedes Certificate of Correction issued October 8, 2002.

Signed and Sealed this

Tenth Day of December, 2002

JAMES E. ROGAN
*Director of the United States Patent and Trademark Office*